United States Patent
Lin et al.

(10) Patent No.: US 9,327,369 B2
(45) Date of Patent: May 3, 2016

(54) METHOD OF MANUFACTURING THERMAL MODULE WITH ENHANCED ASSEMBLING STRUCTURE

(71) Applicant: ASIA VITAL COMPONENTS CO., LTD., New Taipei (TW)

(72) Inventors: Sheng-Huang Lin, New Taipei (TW); Kuo-Sheng Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 119 days.

(21) Appl. No.: 14/205,289

(22) Filed: Mar. 11, 2014

(65) Prior Publication Data
US 2015/0258643 A1 Sep. 17, 2015

(51) Int. Cl.
*H01L 23/00* (2006.01)
*B23P 15/26* (2006.01)
*F28D 1/00* (2006.01)

(52) U.S. Cl.
CPC . *B23P 15/26* (2013.01); *F28D 1/00* (2013.01); *H01L 23/00* (2013.01); *B23P 2700/10* (2013.01); *Y10T 29/4935* (2015.01)

(58) Field of Classification Search
CPC .................. Y10T 29/49353; Y10T 29/49915; B21D 53/02; B21D 53/06; B21D 53/08; B23P 15/26; F28D 15/00; F28D 15/0225; F28D 15/0275; F28D 15/0283; F28F 9/16; F28F 9/162; F28F 9/165; F28F 9/167; F28F 9/002; H01L 23/427
USPC ........................................................ 29/890.03
See application file for complete search history.

(56) References Cited

U.S. PATENT DOCUMENTS

| | | | | | |
|---|---|---|---|---|---|
| 5,826,645 | A | * | 10/1998 | Meyer, IV | F28D 15/02 165/104.33 |
| 7,343,770 | B2 | * | 3/2008 | Barnoski | B21D 28/02 100/214 |
| 7,589,962 | B1 | * | 9/2009 | Bhatia | F28D 15/0233 165/104.19 |
| 2001/0050165 | A1 | * | 12/2001 | Cheung | F28D 15/02 165/104.34 |
| 2009/0266513 | A1 | * | 10/2009 | Xiong | H01L 23/427 165/80.3 |
| 2009/0266518 | A1 | * | 10/2009 | Huang | F28D 15/0266 165/104.19 |
| 2012/0117804 | A1 | * | 5/2012 | Chen | F28D 15/02 29/890.054 |
| 2013/0120937 | A1 | * | 5/2013 | Liao | H01L 23/427 361/700 |

* cited by examiner

*Primary Examiner* — David Bryant
*Assistant Examiner* — Lawrence Averick
(74) *Attorney, Agent, or Firm* — C. G. Merserseau; Nikolai & Mersereau, P.A.

(57) ABSTRACT

A thermal module with enhanced assembling structure includes a base and a heat pipe. The base is formed on a middle portion with a longitudinal receiving recess, which has two end portions forming two supporting portions and a middle portion formed into an opening. A first and a second extended arm are formed at junctions between the receiving recess and two longitudinal sides of the opening. Wall surfaces of the first and second extended arms adjacent to the longitudinal sides of the opening are formed with alternating elevated and sunken areas. The heat pipe is held down in the receiving recess by the first and second extended arms to fitly engage with the elevated and sunken areas. Therefore, there is an increased fitting tightness between the heat pipe and the base to ensure enhanced assembling strength of the thermal module and reduce the manufacturing cost thereof.

4 Claims, 9 Drawing Sheets

METHOD OF MANUFACTURING THERMAL MODULE WITH ENHANCED ASSEMBLING STRUCTURE

FIELD OF THE INVENTION

The present invention relates to a thermal module with enhanced assembling structure, and more particularly to a thermal module having increased assembling strength and reduced manufacturing cost.

BACKGROUND OF THE INVENTION

The progress in the electronic technology enables various chips, such as the central processing unit (CPU), to have gradually reduced volume. Meanwhile, for the chips to process more data, the number of electronic components provided on the presently available chips is several times higher than that on the conventional chips of the same volume. When the number of electronic components on the chips increases, the heat generated by the electronic components during operation thereof also increases. For example, the heat generated by the CPU during operation thereof is high enough to burn out the whole CPU. Thus, it is always a very important issue as how to properly provide a heat dissipation device for various chips.

The currently available heat-dissipation devices and thermal modules are assembled from multiple similar and different heat-dissipation elements, such as a heat pipe, a heat sink and a heat-dissipation base. These heat-dissipation elements are usually welded to one another. However, for heat-dissipation elements made of an aluminum material, some procedures facilitating good welding must be performed before the aluminum heat-dissipation elements can be welded together with specific welding. Therefore, the forming of the conventional thermal modules involves complicated processing procedures and accordingly requires high manufacturing cost.

There are also manufacturers who use fastening elements, such as screws, to assemble different heat-dissipation elements together. However, not all the heat-dissipation elements can be assembled to one another with the screws. For example, the screws can be used to fasten heat radiation fins to a heat-dissipation base, but could not be used to fasten a heat pipe to a heat-dissipation base.

According to a conventional technical means for assembling the heat pipe to a heat-dissipation base, a recess is formed on the base and the heat pipe is set in the recess on the base. While this assembling way overcomes the problem in welding and screwing the heat-dissipation elements to form the thermal module, the thermal module so formed tends to have poor heat transfer efficiency due to high thermal resistance caused by the clearance existed between the assembled base and the heat pipe. In addition, the contact surfaces between the base and the heat pipe are substantially flat and smooth surfaces that have relatively small frictional force between them, which leads to relatively low fitting tightness in the longitudinal direction between the heat pipe and the base of the thermal module.

In brief, the conventional thermal module has the following disadvantages: (1) requiring higher manufacturing cost; (2) having lower heat transfer efficiency; and (3) having relatively poor assembling strength in the longitudinal direction of the heat pipe.

It is therefore tried by the inventor to develop an improved thermal module with enhanced assembling structure to overcome the disadvantages in the prior art thermal module.

SUMMARY OF THE INVENTION

A primary object of the present invention is to provide a thermal module with enhanced assembling structure, so that a base and a heat pipe forming the thermal module can be more firmly assembled together.

Another object of the present invention is to provide a thermal module with enhanced assembling structure, so that a heat pipe can be more tightly assembled to a base in a longitudinal direction to form the thermal module.

A further object of the present invention is to provide a thermal module with enhanced assembling structure, so as to reduce the manufacturing cost of the thermal module.

A still further object of the present invention is to provide a thermal module with enhanced assembling structure, so as to increase the heat transfer efficiency of the thermal module.

To achieve the above and other objects, the thermal module with enhanced assembling structure according to the present invention includes a base and a heat pipe. The base has a top and a bottom defined as a first side and a second side, respectively, and has a longitudinal receiving recess formed at a middle area thereof. The receiving recess has a middle portion formed into an opening that communicates the first side with the second side, and two end portions respectively forming a supporting portion. The receiving recess is so configured that a first extended arm and a second extended arm are formed at junctions between two longitudinal sides of the opening and the first side of the base. Two wall surfaces located at junctions between the first and the second extended arm and the two longitudinal sides of the opening are respectively formed with a row of alternating elevated and sunken areas. The heat pipe has a top surface and a bottom surface, and is set in the receiving recess with the bottom surface fitly contacting with the supporting portions and the alternating elevated and sunken areas. The first and the second extended arm are bent under a force to hold down the heat pipe in the receiving recess with the top surface of the heat pipe being flush with the first side of the base. At this point, areas on the bottom surface of the heat pipe in contact with the alternating elevated and sunken areas are deformed under the force to firmly engage with the alternating elevated and sunken areas.

According to the present invention, the first and the second extended arm are formed at junctions between the opening of the receiving recess and the first side of the base, and the two rows of alternating elevated and sunken areas are formed on the wall surfaces located between the opening and the first and the second extended arm. After the heat pipe is set in the receiving recess on the base, a downward force is applied to deform the first and the second extended arm for them to press against and accordingly hold down the heat pipe, such that the top surface of the heat pipe is flush with the first side of the base. Meanwhile, the bottom surface of the heat pipe under the downward force is deformed at areas that are in contact with the two rows of alternating elevated and sunken areas. That is, the bottom surface of the heat pipe is deformed to tightly engage with the alternating elevated and sunken areas. In this manner, the heat pipe is clamped to the base and prevented from sliding in the receiving recess in a longitudinal direction. In other words, according to the arrangements of the present invention, the heat pipe is set in the receiving recess with an increased fitting tightness in the longitudinal direction between the heat pipe and the base, giving the thermal module formed from the base and the heat pipe a largely enhanced assembling strength.

Further, with the above arrangements, the cost of using fastening elements, such as screws, to assemble the heat pipe to the base can be saved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
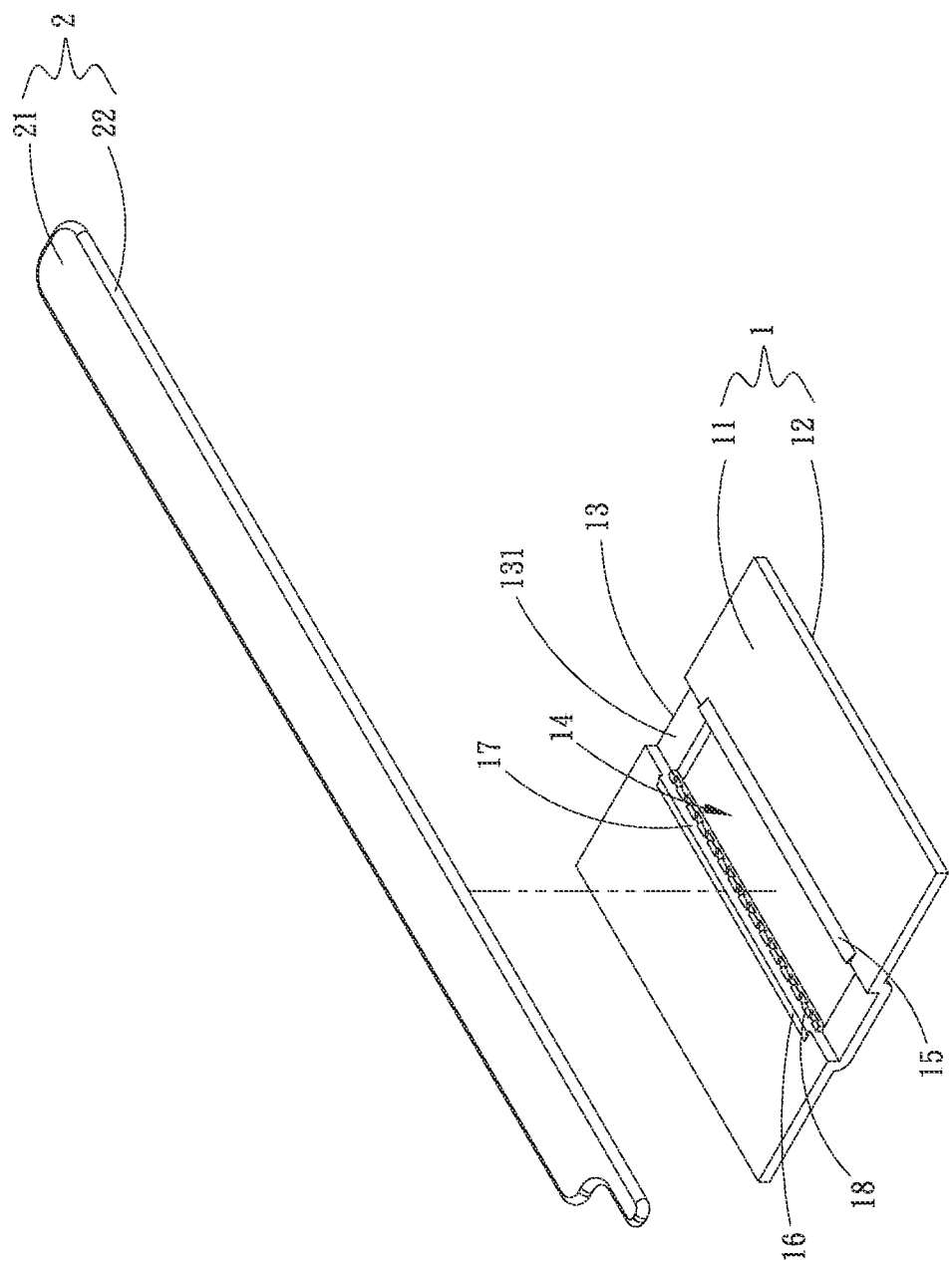
FIG. 1A is an exploded perspective view of a thermal module with enhanced assembling structure according to a first embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 1B:
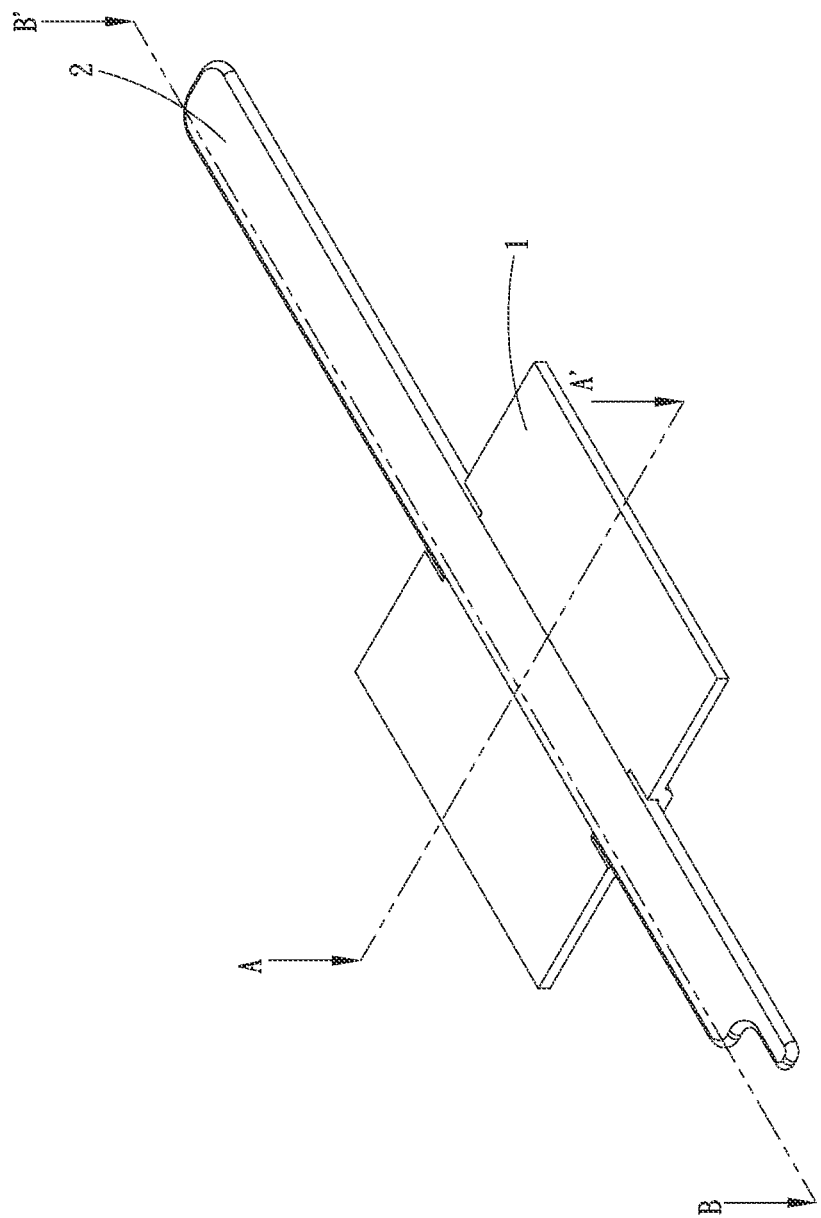
FIG. 1B is an assembled view of FIG. 1A.
Figure 1C:
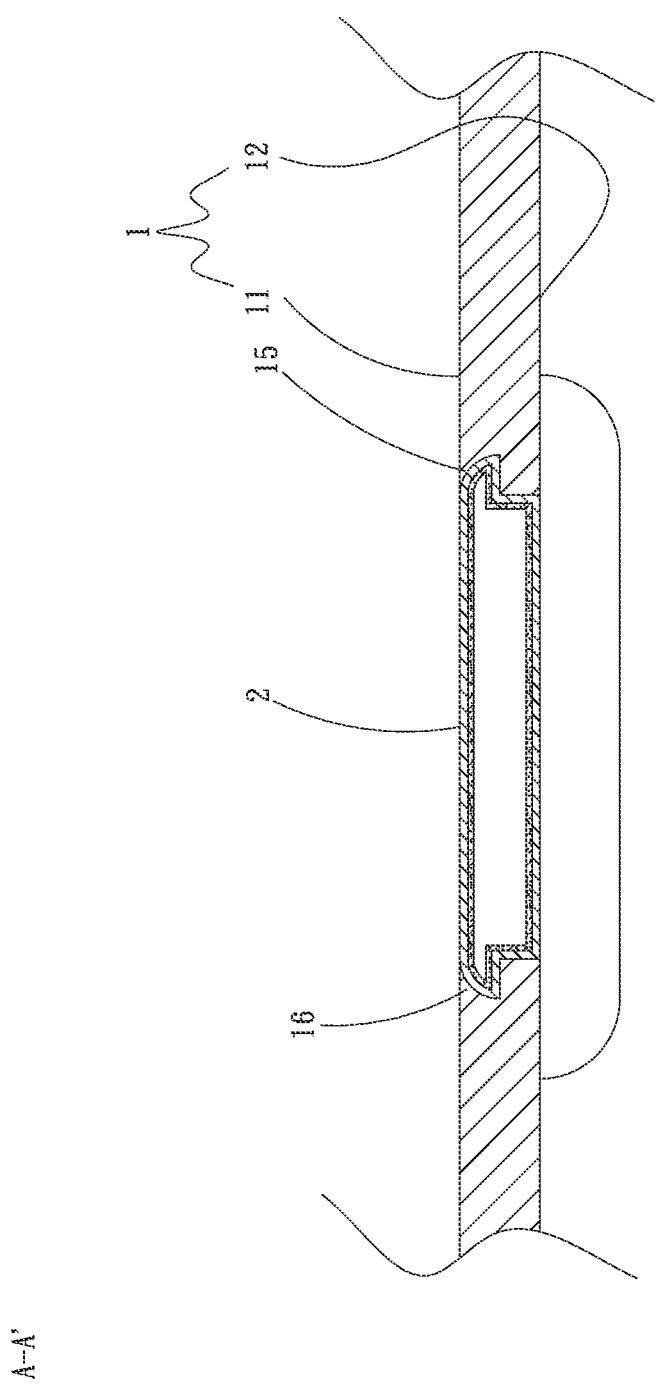
FIG. 1C is a fragmentary sectional view taken along line A-A' of FIG. 1B.
Figure 1D:
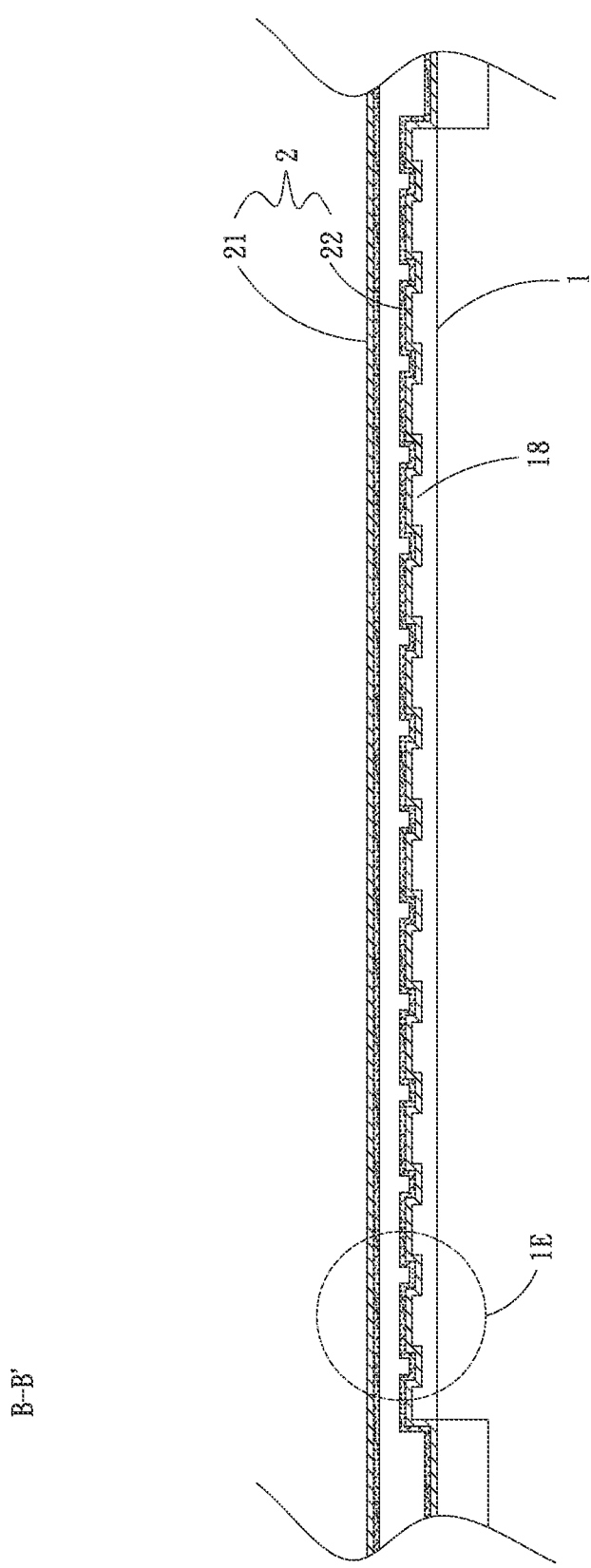
FIG. 1D is a fragmentary sectional view taken along line B-B' of FIG. 1B.
Figure 1E:
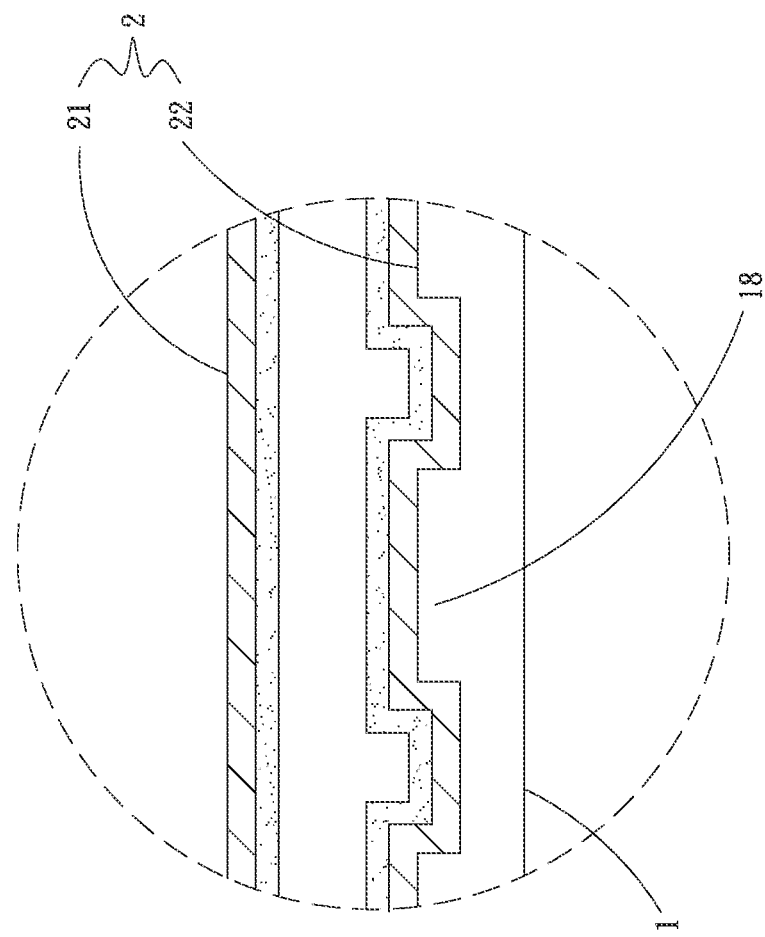
FIG. 1E is an enlarged view of the circled area of FIG. 1D.

Please refer to FIGS. 1A and 1B that are exploded and assembled perspective views, respectively, of a thermal module with enhanced assembling structure according to a first embodiment of the present invention. For the purpose of conciseness and clarity, the present invention is also briefly referred to as "the thermal module" herein. As shown, in the first embodiment, the thermal module includes a base 1 and a heat pipe 2. The base 1 has a top defined as a first side 11 and a bottom defined as a second side 12, and has a longitudinal receiving recess 13 formed at a middle area thereof. The receiving recess 13 has a middle portion formed into an opening 14 and two end portions respectively forming a supporting portion 131. The opening 14 communicates the first side 11 with the second side 12. The receiving recess 13 is so configured that a first extended arm 15 and a second extended arm 16 are formed at junctions between two longitudinal sides of the opening 14 of the receiving recess 13 and the first side 11 of the base 1. FIG. 1C is a sectional view taken along line A-A of FIG. 1B, FIG. 1D is a sectional view taken along line B-B' of FIG. 1B, and FIG. 1E is an enlarged view of the circled area of FIG. 1D. Please refer to FIGS. 1C, 1D and 1E along with FIGS. 1A and 1B. On each of two wall surfaces 17, which are located between the two longitudinal sides of the opening 14 and the first and the second extended arm 15, 16, respectively, there is formed a row of alternating elevated and sunken areas 18, preferably located closer to the second side 12 of the base 1.

The heat pipe 2 has a top surface 21 and a bottom surface 22, and is set in the receiving recess 13 with the bottom surface 22 fitly contacting with the supporting portions 131 and the alternating elevated and sunken areas 18. As can be seen in FIG. 1C, the first and the second extended arm 15, 16 can be deformed under a downward force to press against the heat pipe 2, so that the top surface 21 of the heat pipe 2 is flush with the first side 11 of the base 1. In the first embodiment, the heat pipe 2 is illustrated as a flat heat pipe. However, in practical implementation of the present invention, the heat pipe 2 can be a round-sectioned or a D-sectioned heat pipe without the need of being limited to the flat heat pipe.

Please refer to FIGS. 1A to 1E at the same time. According to the present invention, the first and the second extended arm 15, 16 are formed at junctions between two longitudinal sides of the opening 14 and the first side 11 of the base 1, and the two rows of alternating elevated and sunken areas 18 are formed on the wall surfaces 17 located between the longitudinal sides of the opening 14 and the first and the second extended arm 15, 16. After the heat pipe 2 is set in the receiving recess 13 on the base 1, a downward force is applied to deform the first and the second extended arm 15, 16 for them to press against and hold down the heat pipe 2, such that the top surface 21 of the heat pipe 2 is flush with the first side 11 of the base 1. Meanwhile, under the downward force, the bottom surface 22 of the heat pipe 2 is deformed at areas that are in contact with the alternating elevated and sunken areas 18. That is, the bottom surface 22 of the heat pipe 2 is deformed to form two rows of alternating sunken and elevated areas that are fitly engaged with the alternating elevated and sunken areas 18, as shown in FIGS. 1C and 1D. In this manner, the bottom surface 22 of the heat pipe 2, which is clamped to the receiving recess 13 by the first and second extended arms 15, 16, is in tight contact with the supporting portions 131 and engaged with the alternating elevated and sunken areas 18, preventing the heat pipe 2 from axially moving in the receiving recess 13. In other words, according to the arrangements of the present invention, the fitting tightness between the heat pipe 2 and the base 1 in a longitudinal direction is increased to largely enhance the assembling strength of the thermal module.

Further, since the heat pipe 2 set in the receiving recess 13 is fully held down by the first and the second extended arm 15, 16 and firmly clamped to the alternating elevated and sunken areas 18, no clearance is existed between the heat pipe 2 and the base 1 to cause any problem of thermal resistance that has adverse influence on the heat transfer from the base 1 to the heat pipe 2. Therefore, the thermal module according to the present invention can have largely upgraded heat transfer efficiency. Further, with the arrangements of the present invention, the heat pipe 2 can be assembled to the base 1 without the need of using fastening elements, such as screws. Therefore, the cost of using fastening elements to assemble the thermal module can be saved.

Figure 2A:
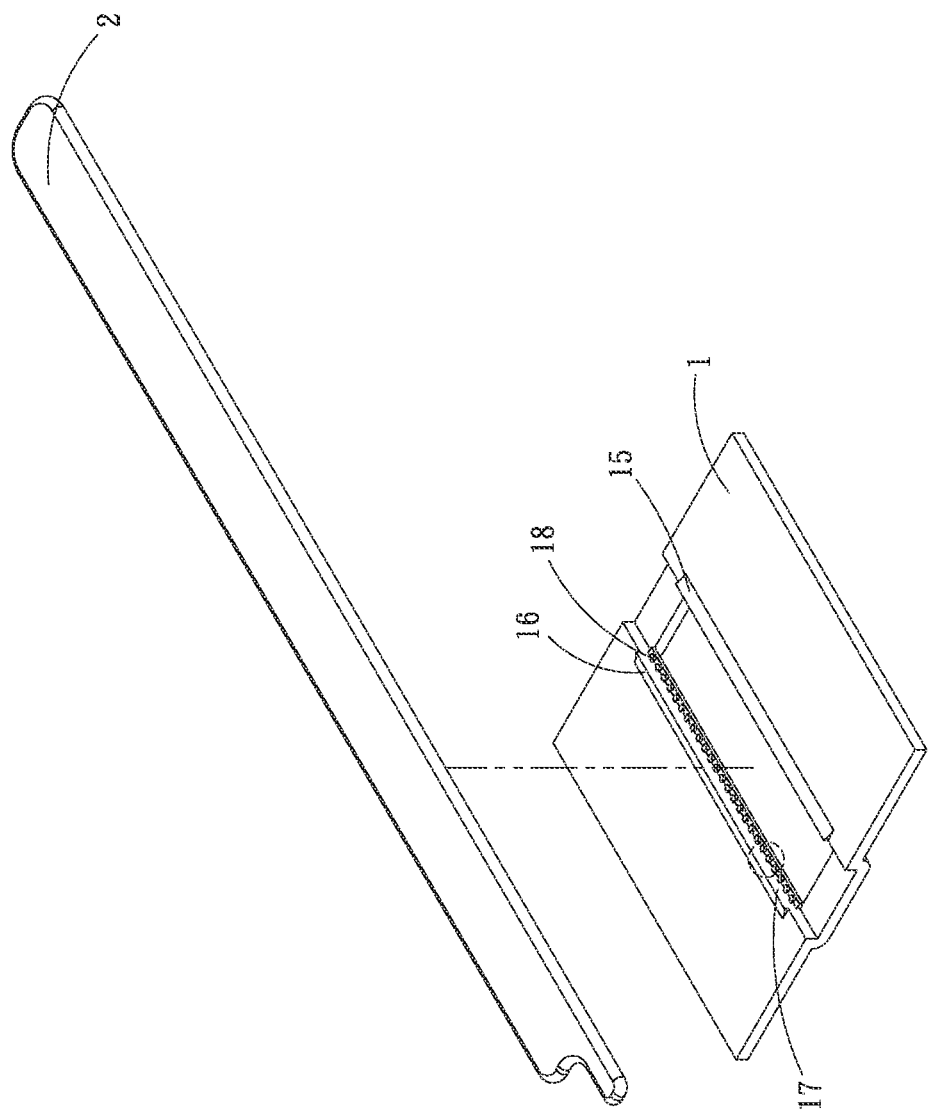
FIG. 2A is an exploded perspective view of a thermal module with enhanced assembling structure according to a second embodiment of the present invention.
Figure 2B:
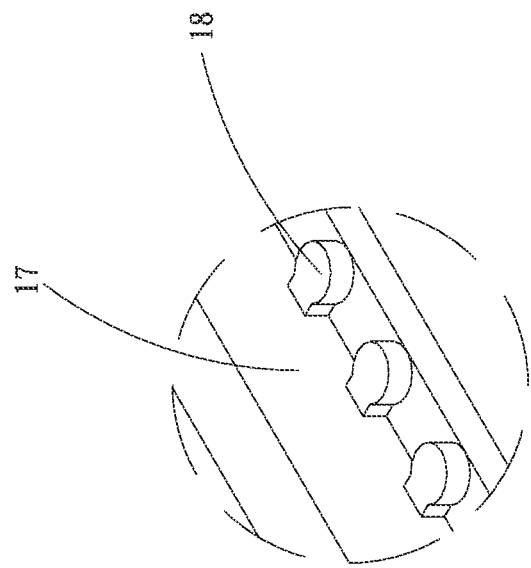
FIG. 2B is an enlarged view of the circled area of FIG. 2A.

FIG. 2A is an exploded perspective view of a thermal module according to a second embodiment of the present invention and FIG. 2B is an enlarged view of the circled area of FIG. 2A. As shown, the second embodiment is generally structurally similar to the first embodiment but includes alternating elevated and sunken areas 18 having a shape different from that in the first embodiment. In the present invention, the elevated and sunken areas 18 can be differently shaped according to a user's actual need in use. For example, the elevated and sunken areas 18 can be any geometrical shape, such as a round, a triangular, a square or a letter V shape.

Figure 3A:
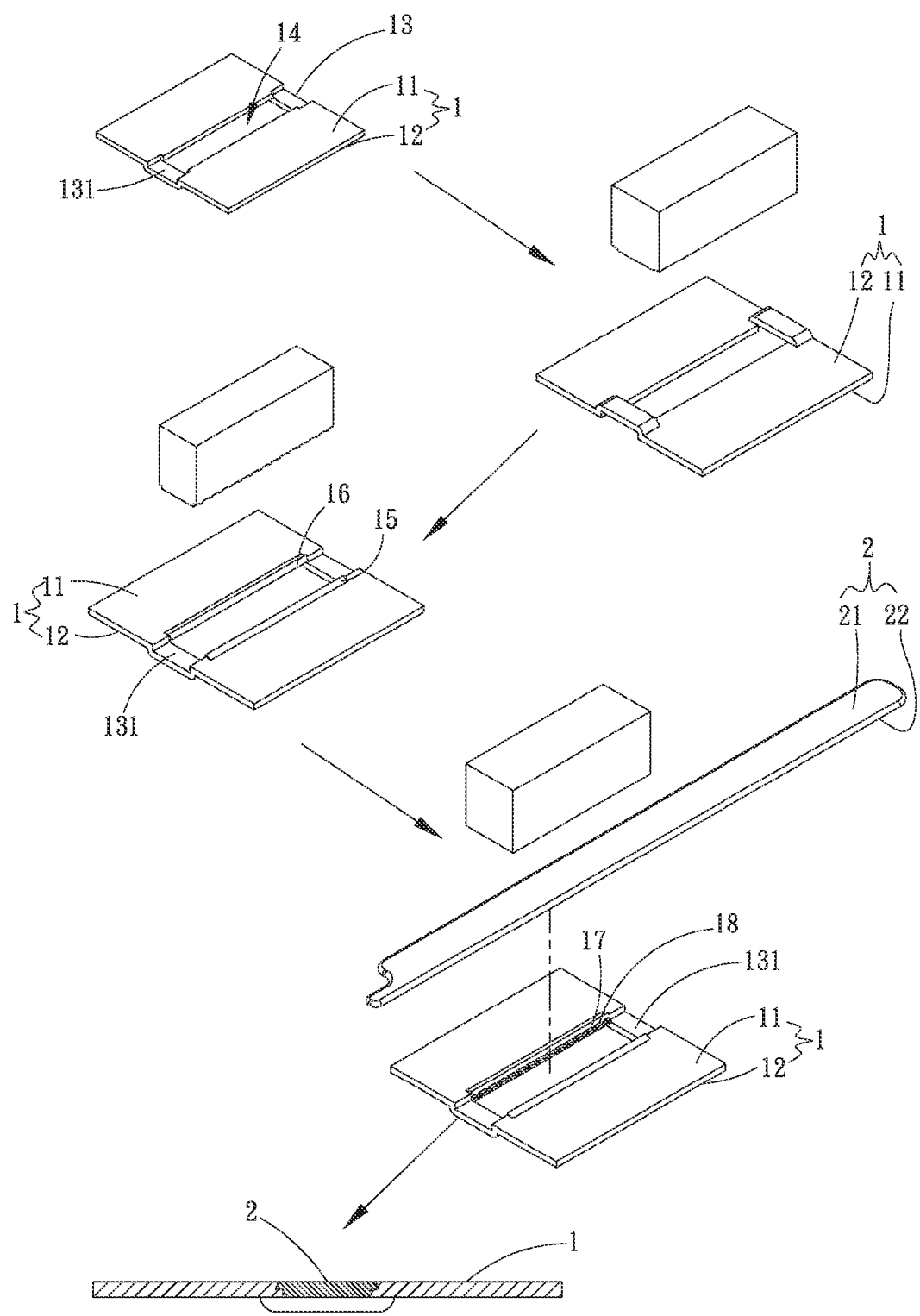
FIG. 3A is a pictorial illustration of the steps included in a method according to the present invention for manufacturing a thermal module with enhanced assembling structure.
Figure 3B:
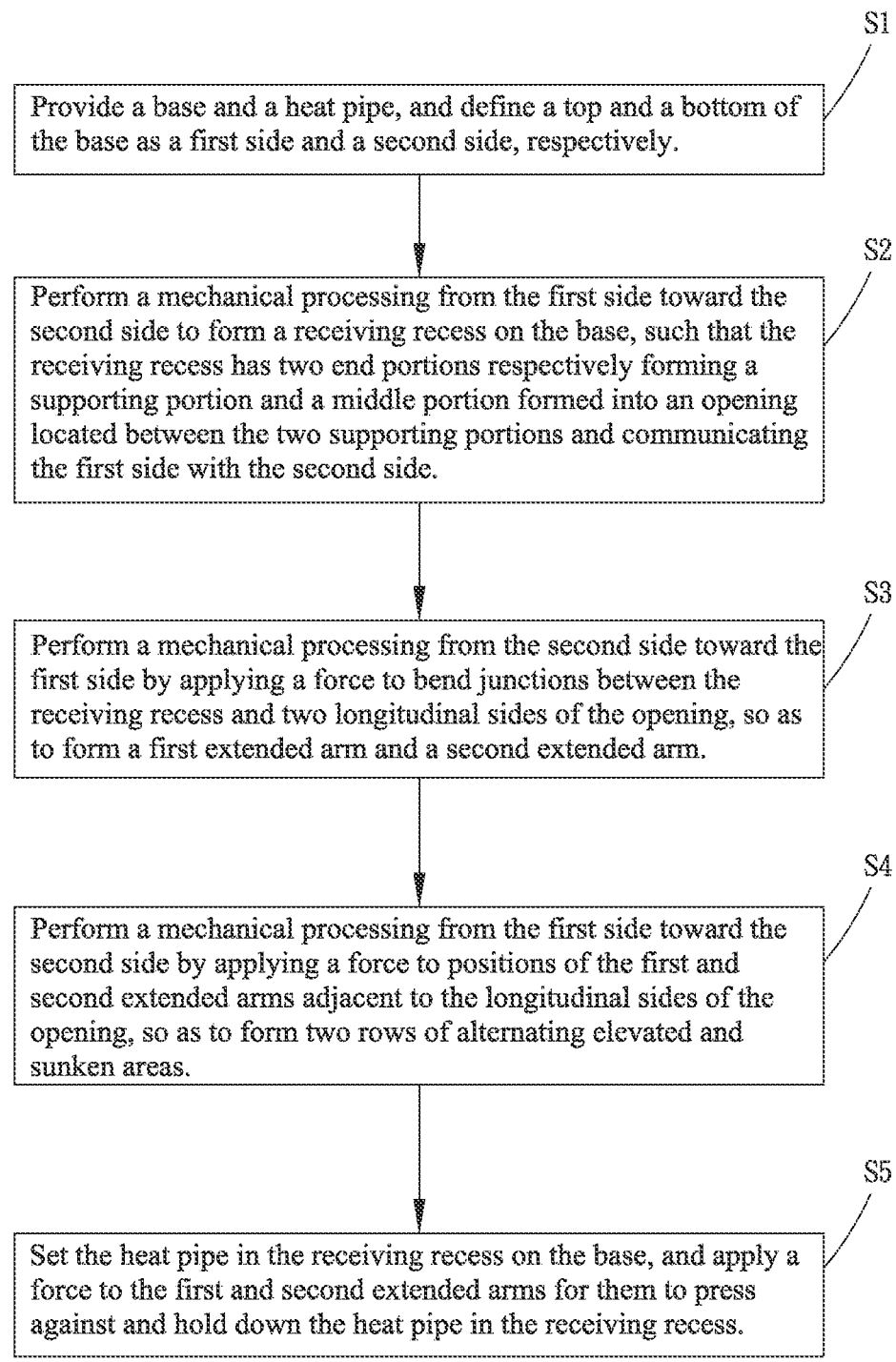
FIG. 3B is a flowchart showing the steps included in the method of the present invention.

The present invention also provides a method of manufacturing a thermal module with enhanced assembling structure. FIG. 3A is a pictorial illustration of the steps included in the method of the present invention, and FIG. 3B is a flowchart showing the steps S1 to S5 included in the method of the present invention. Please refer to FIGS. 3A and 3B at the same time.

In the first step S1, a base and a heat pipe are provided, and the base has a top defined as a first side and a bottom defined as a second side.

More specifically, in the first step S1 of the method according to the present invention, a base 1 and a heat pipe 2 are provided, and a top and a bottom of the base 1 are defined as a first side 11 and a second side 12, respectively.

In the second step S2, the base is mechanically processed from the first side toward the second side to form a receiving recess on the base. The receiving recess has two end portions respectively forming a supporting portion, and an opening located between the two supporting portions to communicate the first side with the second side of the base.

More specifically, in the second step S2 of the method according to the present invention, through a mechanical processing, a force is applied to the first side 11 toward the second side 12 of the base 1, such that a receiving recess 13 is formed on the base 1. The receiving recess 13 has two end portions that respectively form a supporting portion 131, and an opening 14 located between the two supporting portions 131 to communicate the first side 11 with the second side 12.

In the third step S3, the base is further mechanically processed from the second side toward the first side, so that junctions between two longitudinal sides of the opening and the receiving recess are subjected to a force and bent toward the first side to form a first extended arm and a second extended arm.

More specifically, in the third step S3 of the method according to the present invention, the base 11 is subjected to another mechanical processing from the second side 12 toward the first side 11, so that junctions between two longitudinal sides of the opening 14 and the receiving recess 13 are subjected to a force and bent toward the first side 11 to form a first extended arm 15 and a second extended arm 16.

In the fourth step S4, the first and second extended arms are mechanically processed by applying a force thereto from the first side toward the second side of the base, so that two rows of alternating elevated and sunken areas are formed at positions near the two longitudinal sides of the opening.

More specifically, in the fourth step S4 of the method according to the present invention, positions on the first extended arm 15 and the second extended arm 16 adjacent to the opening 14 are subjected to a mechanical processing from the first side 11 toward the second side 12 of the base 1 to form two rows of alternating elevated and sunken areas 18.

In the fifth step S5, set the heat pipe in the receiving recess on the base and apply a force to the first and second extended arms for them to press against and hold down the heat pipe.

More specifically, finally, in the fifth step S5 of the method according to the present invention, the heat pipe 2 is set in the receiving recess 13 on the base 1, and a force is applied to bend the first and the second extended arm 15, 16 for them to hold down the heat pipe 2 in the receiving recess 13.

In the method of the present invention, the mechanical processing includes but not limited to stamping.

In summary, in the method of the present invention for manufacturing a thermal module with enhanced assembling structure, first apply a force from the first side 11 toward the second side 12 of the base 1 to form the receiving recess 13 having two supporting portions 131 at two end portions and an opening 14 at a middle portion. Then, apply a force from the second side 12 toward the first side 11 of the base 1 to form the first and the second extended arm 15, 16 at the junctions between the receiving recess 13 and two longitudinal sides of the opening 14. Further, apply a force from the first side 11 of the base 1 to two wall surfaces 17 located between the first and the second extended arm 15, 16 and the opening 14, so that two rows of alternating elevated and sunken areas 18 are formed on the two wall surfaces 17. Finally, set the heat pipe 2 in the receiving recess 13 on the base 1 and mechanically apply a force to bend and press the first and the second extended arm 15, 16 against the heat pipe 2, so that the heat pipe 2 is flush with the first side 11 of the base 1. At this point, the bottom surface 22 of the heat pipe 2 is deformed under the force to tightly contact with the supporting portions 131 and engage with the alternating elevated and sunken areas 18. Therefore, the heat pipe 2 is clamped to the base 1 to form a thermal module and could not be longitudinally slid in the receiving recess 13, which creates an increased fitting tightness between the base 1 and the heat pipe 2 and gives the thermal module largely upgraded assembling strength.

According to the method of the present invention, since the heat pipe 2 set in the receiving recess 13 is fully held down by the first and the second extended arm 15, 16 and firmly clamped to the alternating elevated and sunken areas 18, no clearance is existed between the heat pipe 2 and the base 1 to cause any problem of thermal resistance. Therefore, the thermal module according to the present invention can have largely upgraded heat transfer efficiency. Further, with the method of the present invention, the heat pipe 2 can be assembled to the base 1 without the need of using fastening elements, such as screws. Therefore, the cost of using fastening elements to assemble the thermal module can be saved.

In brief, the thermal module and the method of manufacturing same according to the present invention are superior to the prior art due to the following advantages: (1) providing enhanced assembling strength; (2) enabling increased fitting tightness between the base and the heat pipe in the longitudinal direction; (3) reducing the manufacturing cost of the thermal module; and (4) providing upgraded heat transfer efficiency.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method of manufacturing a thermal module with enhanced assembling structure, comprising the following steps:

providing a base and a heat pipe, and defining a top and a bottom of the base as a first side and a second side, respectively;

performing a mechanical processing from the first side toward the second side to form a receiving recess on the base, such that the receiving recess having two end portions respectively forming a supporting portion and a middle portion formed into an opening located between the two supporting portions and communicating the first side with the second side;

performing a mechanical processing from the second side toward the first side by applying a force to bend junctions between the receiving recess and two longitudinal sides of the opening, so as to form a first extended arm and a second extended arm, and two wall surfaces being located between the two longitudinal sides of the opening and the first and the second extended arms, respectively;

performing a mechanical processing from the first side toward the second side by applying a force to positions of the first and second extended arms adjacent to the longitudinal sides of the opening, so as to form two rows of alternating elevated and sunken areas on the wall surfaces; and setting the heat pipe in the receiving recess on the base, and applying a force to the first and second extended arms for them to press against and hold down the heat pipe in the receiving recess.

2. The method of manufacturing a thermal module with enhanced assembling structure as claimed in claim 1, wherein each mechanical processing is stamping.

3. The method of manufacturing a thermal module with enhanced assembling structure as claimed in claim 2, wherein the heat pipe is tightly fitted in the receiving recess through a further mechanical processing.

4. The method of manufacturing a thermal module with enhanced assembling structure as claimed in claim 3, wherein the further mechanical processing is stamping.

* * * * *